United States Patent [19]
Madert
[11] 3,715,681
[45] Feb. 6, 1973

[54] FREQUENCY DISCRIMINATOR WITH VARIABLE CENTER FREQUENCY

[75] Inventor: Franz Peter Madert, D-8541 Greding der Bundeswehr, Germany

[73] Assignee: The United States of America as represented by the Secretary of the Army

[22] Filed: March 13, 1972

[21] Appl. No.: 234,092

[52] U.S. Cl. ....................... 331/11, 329/112, 331/18
[51] Int. Cl. ............................................. H03b 3/04
[58] Field of Search .................. 331/11, 18; 329/112

*Primary Examiner*—John Kominski
*Attorney*—Harry M. Saragovitz et al.

[57] ABSTRACT

The frequencies of a reference oscillator, a voltage controlled oscillator and a signal source are all converted to dc voltages proportional to their individual frequencies. The voltages from the signal and the voltage controlled oscillator are summed in a summing amplifier and fed to one input of a differential amplifier. The other input of the differential amplifier is fed by the dc voltage from the reference oscillator. The dc output of the differential amplifier is used to control the variable controlled oscillator so that its frequency output will be different from the reference oscillator's frequency output by the frequency of the signal.

2 Claims, 2 Drawing Figures

FREQUENCY DISCRIMINATOR WITH VARIABLE CENTER FREQUENCY

SUMMARY OF THE INVENTION

This invention is basically made up of a reference oscillator and a voltage controlled oscillator whose frequency outputs are fed to a frequency discriminating unit. The frequency discriminating unit also has an input from an incoming signal. The output of the frequency controlled unit is a dc voltage which will control the frequency of the voltage controlled oscillator so that its output will be at a frequency which is different from the reference frequency by the incoming signal frequency. In this way the output frequencies of the reference oscillator and the voltage controlled oscillator can be acted upon by other circuitry and then later subtracted leaving the frequency of the incoming signal as it would be if it were acted upon alone by the other circuitry.

The frequency discriminator unit is made up of three frequency-to-dc converters each having an input connected to the output of the oscillators and the signal frequency. The dc output of the converter connected to the reference oscillator is fed to one input of a differential amplifier. DC outputs of the other converters are connected to a summing amplifier whose output is connected to the other input of the differential amplifier. The output of the differential amplifier will be a dc voltage which, when connected to the voltage controlled oscillator, will control that oscillator to have a frequency different from the frequency of the reference oscillator by an amount equal to the frequency of the incoming signal.

DESCRIPTION OF THE PREFERRED EMBODIMENT

Figure 1:
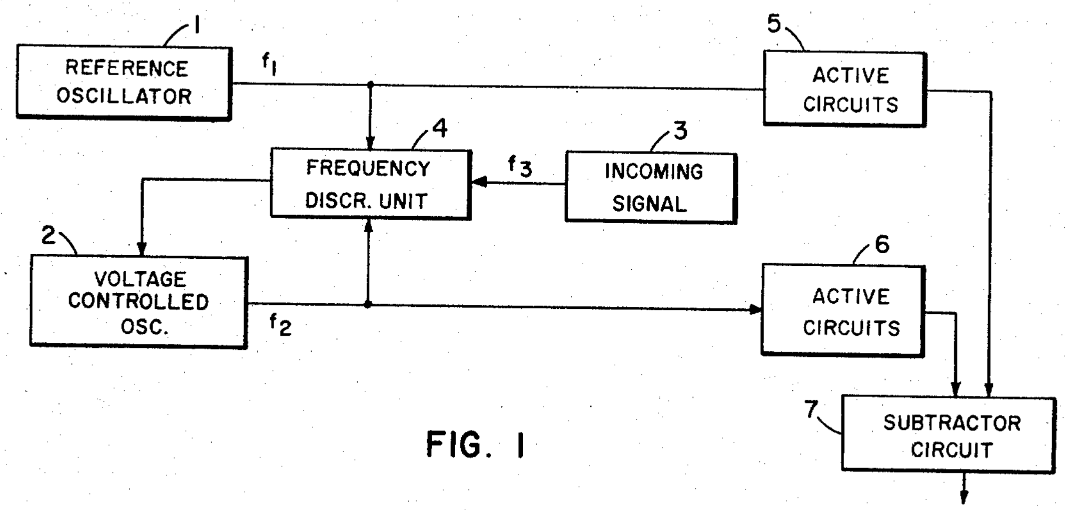
FIG. 1 is a block diagram of the basic concept of the present invention.

FIG. 1 shows one of the basic uses of the present invention. Reference oscillator 1 and voltage controlled oscillator 2 along with an incoming signal 3 are fed to the frequency discriminator unit 4. The overall object is to indirectly act upon the frequency of the incoming signal 3. To directly act on the incoming signal by the active circuits 5 and 6 would distort the signal and give one an output which is not accurate. The frequency discriminator unit 4 has an output which will control oscillator 2 to a frequency $f2$ which is different from the frequency $f1$ of the oscillator 1 by an amount equal to the incoming signal frequency $f3$. In this way the frequencies $f1$ and $f2$ can be acted upon by identical active circuits 5 and 6 (such as multiplier circuits) and then frequencies are subtracted one from another in circuit 7, leaving one with frequency $f3$ as it would be if acted upon alone by one of the active circuits.

Figure 2:
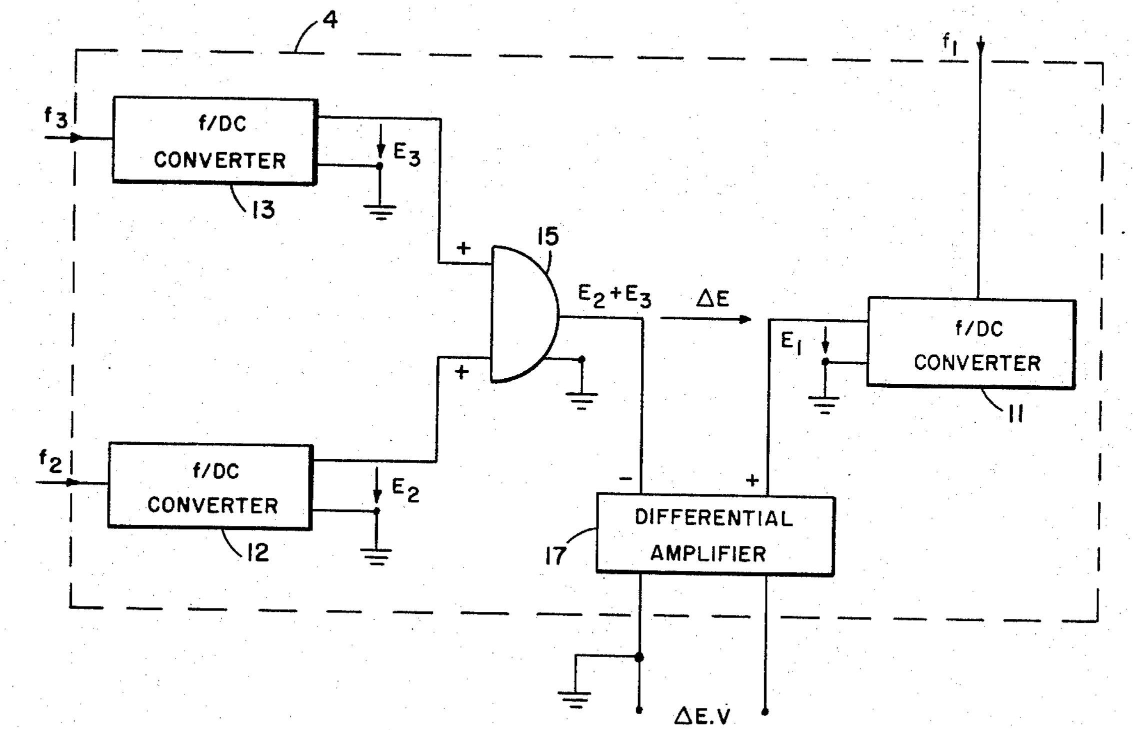
FIG. 2 is a block diagram in more detail of the frequency discriminator unit of FIG. 1.

FIG. 2 shows the frequency discriminator 4 in greater detail. Three frequency-to-dc converters 11, 12, and 13 are provided for converting incoming signal $f3$, the reference oscillator frequency $f1$, and the variable controlled oscillator's frequency $f2$ to dc voltages whose magnitudes E1-E3 are proportional to the input frequencies. A summing amplifier 15 is connected to the outputs of converters 12 and 13 so as to have an output E2 plus E3 which is proportional to the sum of the frequencies $f2$ and $f3$. This output is fed to one input of a differential amplifier 17. The other input is fed the voltage E1 from converter 11. Therefore, the output of differential amplifier 17 is a dc voltage proportional to the frequency difference of the reference oscillator and the sum of the voltage controlled oscillator frequency in the incoming signal frequency ($f1$ minus $f2$ plus $f3$).

This system decides by the polarity output of amplifier 17 wheither $f1$ is greater or smaller than $f2$ plus $f3$ regardless of the relationships between $f1$ and $f2$. Also it has no restrictions for use in controlling $f1$.

The frequency-to-dc converters may be made of several different forms, for example a commercial frequency meter with analog dc output voltage or a digital frequency meter with analog dc output voltage. The latter may be a monostable multivibrator whose repetition frequency is varied by the frequency to be measured. The dc component of the output of this multivibrator is proportional to the applied frequency.

I claim:

1. A frequency discriminator comprising first, second, and third frequency-to-dc converters each having an input and an output; first, second, and third frequency sources connected to the inputs of corresponding converters; summing means having two inputs and an output; said summing means inputs being connected to outputs of said first and second converter means so as to sum their outputs at the summing means output; a differential amplifier having one input connected to the output of said summing means, and the other input connected to the output of said third converter; and said differential amplifier having an output which is proportional to the difference between the frequency of the third frequency source and the sum of the frequencies of the first and second frequency sources.

2. A frequency discriminator as set forth in claim 1 wherein said first frequency source is a voltage controlled oscillator having a controlled input connected to the output of said differential amplifier.

* * * * *